United States Patent [19]
Wynne

[11] Patent Number: 5,517,191
[45] Date of Patent: May 14, 1996

[54] DIGITALLY CONTROLLED CALIBRATION CIRCUIT FOR A DAC

[75] Inventor: John Wynne, Dooradoyle, Ireland

[73] Assignee: Analog Devices, Inc., Norwood, Mass.

[21] Appl. No.: 225,971

[22] Filed: Apr. 12, 1994

[51] Int. Cl.$^6$ ................................................ H03M 1/06
[52] U.S. Cl. .............................................. 341/118; 341/135
[58] Field of Search ...................................... 341/118, 120, 341/135, 144

[56] References Cited

U.S. PATENT DOCUMENTS

| | | | |
|---|---|---|---|
| 4,410,879 | 10/1983 | Gumm et al. | 341/118 |
| 4,465,996 | 8/1984 | Boyacigiller et al. | 341/118 |
| 4,578,711 | 3/1986 | White et al. | 358/282 |
| 4,920,344 | 4/1990 | Henderson et al. | 341/118 |
| 4,982,192 | 1/1991 | Murooka | 341/127 |
| 5,410,311 | 4/1995 | Doyle | 341/144 |

*Primary Examiner*—Marc S. Hoff
*Attorney, Agent, or Firm*—Iandiorio & Teska

[57] ABSTRACT

A digitally controlled calibration circuit for a DAC includes a primary DAC having a first reference current input, a second input for receiving a digital signal representative of the DAC conversion factor, and an output for providing the analog signal; a secondary calibration DAC has associated with it a reference network connected to a first input of the secondary DAC for conducting a reference current, and a device for connecting the output of the secondary DAC to the reference network, the second DAC includes a second input for receiving a digital signal for adjusting the output of the secondary DAC fed back to the reference network for adjusting the reference current; and a device for interconnecting the reference current with the first reference current input of the primary DAC for digitally controlling the reference current input of the primary DAC for digitally controlling the reference current to that primary DAC and digitally effecting calibration of the primary DAC.

19 Claims, 3 Drawing Sheets

DIGITALLY CONTROLLED CALIBRATION CIRCUIT FOR A DAC

FIELD OF THE INVENTION

This invention relates to a digitally controlled calibration circuit for a DAC, and more particularly to such a calibration circuit adapted for a color video RAM-DAC.

BACKGROUND OF INVENTION

The advent of personal computers spawned a whole new industry, that of desk top publishing. In desk top publishing applications it is possible to compose an advertisement, a book, a magazine, on the computer screen, print it on a suitable printer and have what is known in the publishing trade as camera ready copy. If the work involves color graphics then obviously a color printer is required. If the work involves no color graphics, i.e., black and white graphics or text only, then the work can be printed out as before or it can be electronically transferred to wherever it is required.

In the case of desk top publishing with color graphics it is very important that the color or colors of the graphic created on the screen by the operator match very closely the color(s) generated by the color printer. If there is any mismatch then the color master produced as hard copy will be different from what the creator intended. This is necessary because in many cases the creator may not have the opportunity of testing the color match by a test print. The creator's work may be going straight into a magazine, book or whatever, and will only be seen in hardcopy when the final product is actually printed. So it is very important to the desk top publishing professional that if they call up colors magenta, green and white on the screen, the electronic descriptions of these exact colors are transferred to the printer. Since the computer doesn't know what green or white looks like it can only go on the color information contained in its color lookup table in pseudo-color systems or, in true color systems, the color information contained in the pixel registers. This information is loaded up by the operating system on power on. It can also be changed at any time by the application program which is running.

If there are any errors in the video display circuitry which might cause one color output to be greater or less than the others or just different from that programmed, then the resultant color on the screen will not be the color the computer "thinks" it is generating and there is no means of reconciling the screen color and the printer color. Errors between red, blue and green guns can occur due to many factors both internal to the video DAC and external. Internal causes would include the silicon processing itself causing mismatches between the three channels. External causes would include the mismatching of the load resistors, cabling, or monitor.

Up to recently the simplest method of ensuring that computer colors were correctly calibrated was to have the computer display a color bar on the screen. The user would then physically hold up a color card to the screen and compare each of the displayed colors to the card colors and check that they were the same. If some difference is noted then the color adjust controls on the monitor would be manually adjusted to achieve correct colors. Systems are now becoming available which do the comparison electronically. This essentially entails holding up a small camera against the screen while a diagnostic program is running. Whatever the mechanism employed, it is presently necessary to manually adjust a resistor or other component to effect a change in the red, green or blue currents $I_{OR}$, $I_{OG}$, $I_{OB}$ which effect the color portrayed on the display. In some cases the adjustment can only be done conjointly for all three colors red, blue and green. In other cases they can be adjusted independently relative to one another. While adjustments could be made forcefully by directly changing output or input currents or even modifying biases or references, such approaches involve extra components external to the basic RAM-DAC systems which may require different fabrication processes unsuited to manufacture on the same chip with the DACs. This adds to the cost and complexity of the ultimate device and may even affect its precision and reliability.

SUMMARY OF INVENTION

It is therefore an object of this invention to provide a digitally controlled calibration circuit for a DAC.

It is a further object of this invention to provide such a calibration circuit which automatically, digitally calibrates a DAC.

It is a further object of this invention to provide such a calibration circuit which permits adjustment via digital commands rather than physical manipulation of components.

It is a further object of this invention to provide such a calibration circuit which can calibrate one or a number of DAC's conjointly or independently.

It is a further object of this invention to provide such a calibration circuit which can be fabricated by the same process and even on the same chip as the primary DAC to be digitally controlled.

It is a further object of this invention to provide such a calibration circuit which can utilize a secondary DAC similar or even identical to the primary DAC.

It is a further object of this invention to provide such a calibration circuit which is accurate, reliable, small, compact, simple and low cost.

This invention results from the realization that a truly automatic, digitally controlled calibration circuit which effects calibration adjustments for a DAC by digital commands as opposed to physical manipulation of components can be achieved by using one or more secondary calibration DACs very similar or identical to the primary DAC or DACs to adjust the reference current of the secondary DAC(s), which reference current(s) is (are) coupled to the primary DAC(s) so that the reference current(s) of the primary DAC(s) is (are) controlled by the digital command to the secondary DAC(s).

This invention features a digitally controlled calibration circuit for a DAC. There is a primary DAC having a first reference current input, a second input for receiving a digital signal representative of the DAC conversion factor, and an output for providing an analog signal. There is a secondary calibration DAC with a reference network connected to a first input for conducting a reference current and there are means for connecting the output of the secondary DAC to the reference network. The secondary DAC includes a second input for receiving a digital signal for adjusting the output of the secondary DAC fed back to the reference network for adjusting the reference current. There are means of interconnecting the reference current with the first reference current input of the primary DAC for digitally controlling the reference current to the primary DAC and digitally effecting calibration of the primary DAC.

In a preferred embodiment the means for interconnecting may be a current mirror and the means for connecting may include a feedback loop. The reference network may include a voltage divider, the voltage divider may include first and second impedances, and those impedances may be resistances. The means for connecting may be a feedback loop which may connect to the junction between the impedances.

The invention also features a digitally controlled calibration circuit including at least one primary DAC having a first input for receiving a reference current, a second input for receiving a digital signal representative of the DAC conversion factor, and an output for providing the analog output signal. There is at least one secondary calibration DAC, with a reference network connected to a first input of the secondary DAC for conducting a reference current, and means for connecting the output of the secondary DAC to the reference network. The secondary DAC has a second input for receiving a digital signal for adjusting the output of the secondary DAC fed back to the reference network for adjusting the reference current. There are means for interconnecting the reference current with the first reference input of at least one primary DAC for digitally controlling the reference current to the at least one primary DAC and digitally effecting calibration of the primary DAC.

In a preferred embodiment there may be a plurality of primary DACs and one secondary calibration DAC which provides the reference current to the reference current inputs of each of the primary DACs for conjointly digitally controlling the outputs of the primary DACs. Alternatively them may be a plurality of primary DACs and a like plurality of secondary calibration DACs. Each of the secondary DACs providing a reference current to a respective associated one of the primary DACs for independently digitally controlling the outputs of the primary DACs relative to one another. Them may be three primary DACs and three secondary calibration DACs, one associated with each of the primary DACs. There may be n primary DACs and n-1 secondary calibration DACs, one associated with each of the n-1 of the primary DACs.

The invention also features a digitally controlled calibration circuit for a color video RAM-DAC. There is a red, a blue and a green primary DAC each having a first input for receiving a reference current, a second input for receiving a digital signal representative of the DAC conversion factor, and an output for providing the analog output signal representative of the respective color. There is a red, a blue and a green secondary calibration DAC, one associated with each of the red, blue and green primary DACs, respectively. Each secondary DAC may have a reference network connected to a first input of the secondary DAC for conducting a reference current. There are means for connecting the output of that secondary DAC to its reference network. Each secondary DAC has a second input for receiving a digital signal for adjusting the output of that secondary DAC fed back to its reference network for adjusting the reference current conducted by that reference network and there are means for interconnecting each of the reference currents of each of the secondary DACs with the first reference current input of the associated one of the primary DACs for digitally controlling the reference current to each of the primary DACs and digitally effecting calibration of that primary DAC.

The invention also features a digitally controlled calibration circuit for a color video RAM-DAC which includes a red, a blue and a green primary DAC each having a first input for receiving a reference current, a second input for receiving a digital signal representative of the DAC conversion factor, and an output for providing the analog output signal representative of the respective color. There are at least two secondary calibration DACs, one associated with each of two of the primary DACs, respectively. Each secondary DAC has a reference network connected to a first input of that secondary DAC for conducting a reference current. There are means for connecting the output of that secondary DAC to its reference network, and each secondary DAC includes a second input for receiving a digital signal for adjusting the output of that secondary DAC fed back to its reference network for adjusting the reference current conducted by that reference network, and them are means for interconnecting each of the reference currents of each of the secondary DACs with a first reference current input of the associated one of the primary DACs for digitally controlling the reference current to at least two of the primary DACs.

DISCLOSURE OF PREFERRED EMBODIMENT

Other objects, features and advantages will occur to those skilled in the art from the following description of a preferred embodiment and the accompanying drawings, in which.

Figure 1:
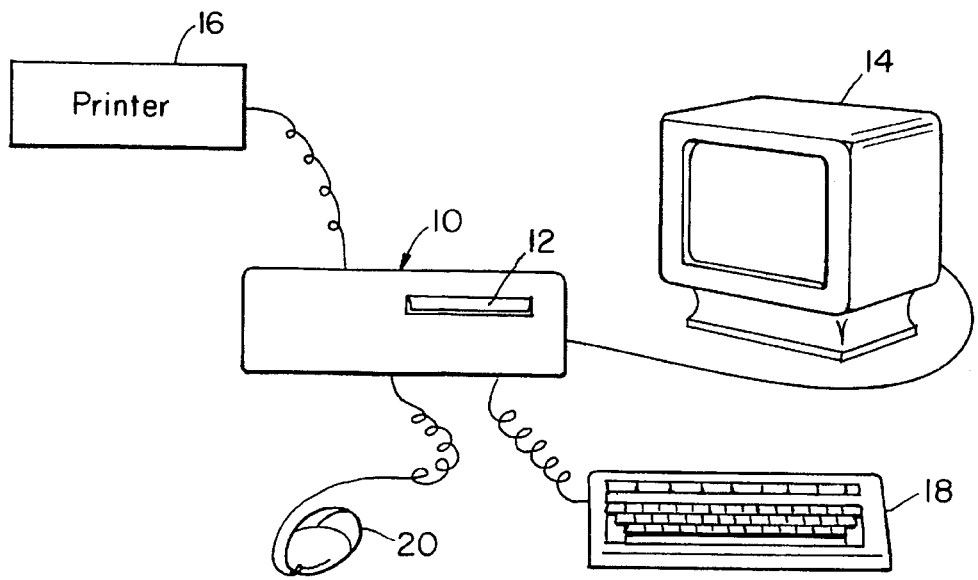
FIG. 1 is a block diagram of a conventional computer such as a PC.

The invention may be accomplished with a primary DAC having a first reference current input and a second input for receiving a digital signal representative of the DAC conversion factor. There is an output providing the analog signal. There is a secondary calibration DAC and associated with it is a reference network connected to a first input of the secondary DAC for conducting a reference current. There are also means such as a feedback loop for connecting the output of the secondary DAC to the reference network. The secondary DAC includes a second input for receiving a digital signal for adjusting the output of the secondary DAC fed back to the reference network in order to adjust the reference current. Finally them is some means for interconnecting the reference current with the first reference current input of the primary DAC for digitally controlling the reference current to the primary DAC and digitally effecting calibration of the primary DAC. The means for interconnecting the reference current to the reference current input may be a current mirror or similar device.

In accordance with this invention in the calibration mode a digital signal or command is provided to the secondary calibration DAC whose output is fed back through the reference network which may be a voltage divider composed of two series connected resistors with the feedback loop connected at the junction of the resistors. When a recalibration or a calibration adjustment is desired, the change order can be entered on a keyboard digitally to provide a digital signal to the secondary calibration DAC to modify its output current, which will then change the reference current flowing in the reference network composed of the two resistors. This reference current is reflected through a current mirror as the $I_{set}$ current to the primary DAC. In this way the primary DAC is adjusted or calibrated without the need for physical manipulation or any penetration of the housing or circuits involved. The calibration could be effected in the calibration mode directly from a digital input such as a keyboard or a touchscreen or a mouse.

The invention is not limited to being accomplished with a single primary DAC and a single secondary calibration DAC. For example, there may be a number of primary DACs all operated through a single secondary calibration DAC. In that case all the primary DACs would be calibrated together. If alternatively it is desired to control the primary DACs independently, then a secondary calibration DAC and reference network may be associated with each of the primary DACs. Actually, in the most efficient circuit design there need be only one less secondary calibration DAC with respect to the number of primary DACs. With n primary DACs and n-1 secondary DACs, each of the n-1 primary DACs having associated with it one of the n-1 secondary DACs can be independently calibrated with respect to any of the other primary DACs. The one primary DAC that does not have a secondary DAC associated with it can be adjusted relative to the other primary DACs simply by adjusting the other primary DACs relative to the uncalibratable primary DAC.

One typical use of the invention is in a color video RAM-DAC system. In that case there will typically be three primary DACs representing red, blue and green, which control the red, blue and green currents $I_{OR}$, $I_{OB}$, $I_{OG}$, that drive a printer.

One of the valuable advantages of this invention is that the digital control is achieved using secondary DACs which are identical or very similar to the primary DACs. This means that they can be fabricated by the same process extremely inexpensively, even mounted on the same chip, thereby maintaining the reliability and precision achievable for the primary DACs.

Figure 2:
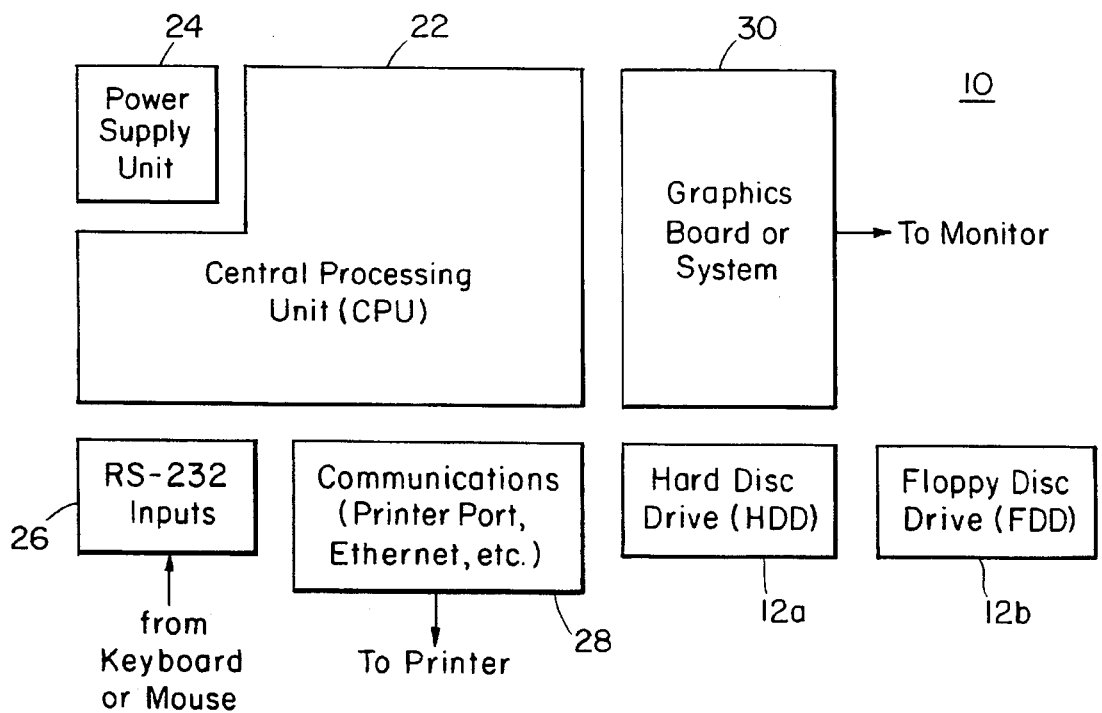
FIG. 2 is a block diagram of the CPU of the computer of FIG. 1.
Figure 3:
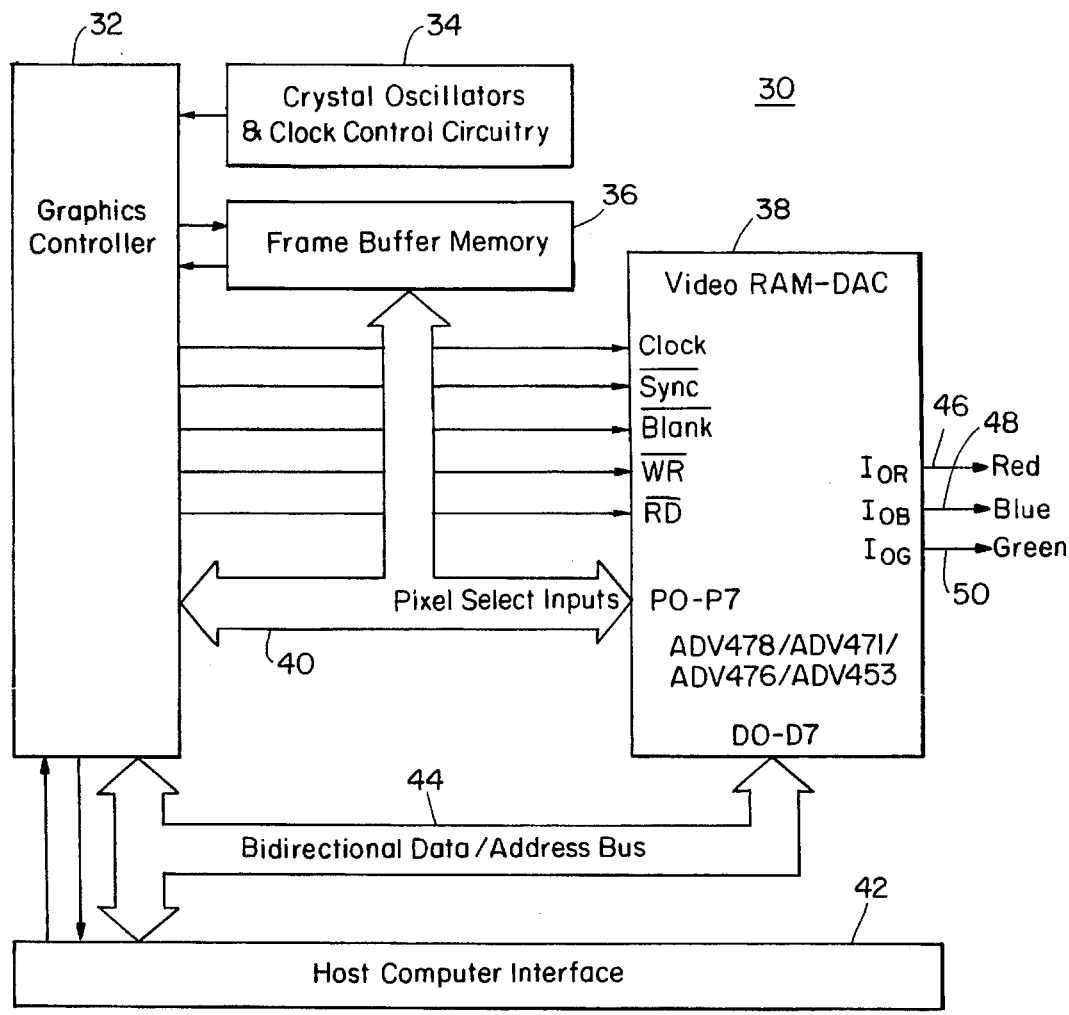
FIG. 3 is a more detailed block diagram of the graphics board of FIG. 2.

There is shown in FIG. 1 a conventional computer such as an IBM PC 10 with disc drive 12, two output devices, display 14 and printer 16, and two input devices, keyboard 18 and mouse 20. When desk top publishers or other graphic software applications are used with the computer system 10, FIG. 1, one of the difficulties is matching the color on the screen of display 14 so that precisely that color appears on the printed output from printer 16. The system that accomplishes this is located in CPU 22, FIG. 2. Also included in computer 12 is a power supply unit 24, an RS-232 input port 26 to receive inputs from, for example, keyboard 18 and mouse 20, a communications port 28 which interconnects the computer with printer 16, for example, and a hard disk drive 12a and floppy disk drive 12b. However, it is the graphics board or system 30 which controls and operates the color printing graphics. Graphic system 30 is shown in greater detail in FIG. 3 as including graphics controller 32 operated under the control of crystal oscillators and clock control circuitry 34. Graphics controller 32 interfaces with frame buffer memory 36 and video RAM-DAC 38 over bidirectional data bus 40. Graphics controller 32 also communicates with host computer interface 42 and video RAM-DAC 38 over bidirectional data address bus 44. Video RAM-DAC 38 may be implemented by any number of circuits including those made by Analog Devices, Inc., of Norwood, Mass., such as ADV478, ADV471, ADV476, or ADV453. The analog output from any of these devices is in the form of the red, the blue and the green signals on lines 46, 48 and 50.

Figure 4:
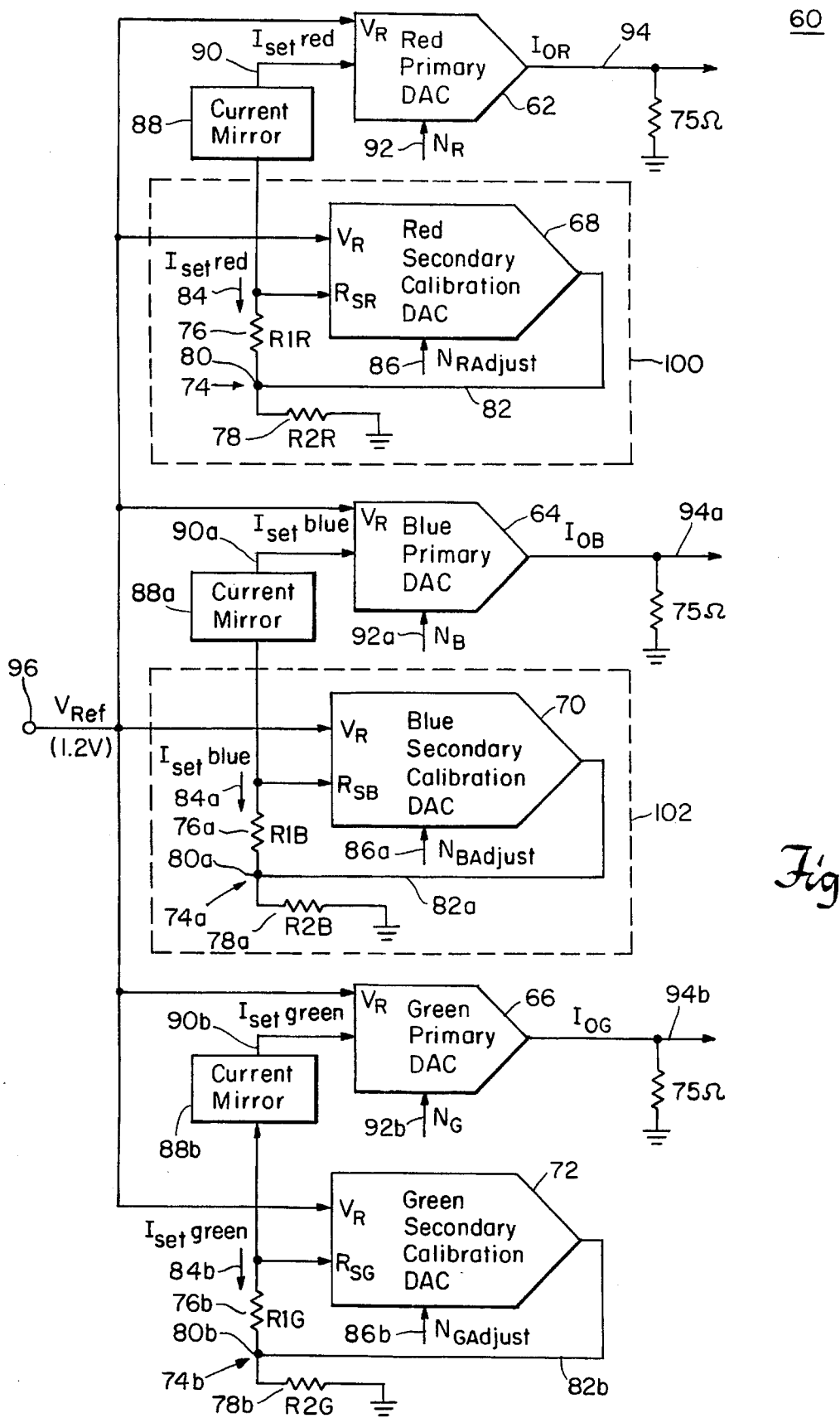
FIG. 4 is a digitally controlled calibration circuit for a DAC implemented in the video RAM-DAC of FIG. 3 to operate three primary DACs, the red, the green and the blue, to provide the color signals to the printer of FIG. 1.

In accordance with this invention the analog output end of the video RAM-DAC may take the form as shown in FIG. 4, where the digitally controlled calibration circuit 60 is shown as including three primary DACs, red primary DAC 62, blue primary DAC 64, and green primary DAC 66, each of which has associated with it a secondary calibration DAC, namely red secondary calibration DAC 68, blue secondary calibration DAC 70, and green secondary calibration DAC 72. Each secondary calibration DAC, as exemplified by red secondary calibration DAC 68, includes a reference network 74 including two resistors 76 and 78 connected in series. There is some means connecting the output of DAC 68 to the junction 80 between resistors 76 and 78 which may simply be a feedback loop 82.

The $I_{set}$ red current indicated at arrow 84 which flows through reference network 74 is modified by a digital command signal $N_{RAdjust}$ on line 86 to DAC 68. The digital command on lines 86 causes a change in the output through feedback loop 82 which changes the reference current $I_{set}$ in reference network 74. This change in the reference current $I_{set}$ red is reflected through current mirror 88 to the $I_{set}$ red input on line 90 of red primary DAC 62 during the calibration mode. After the calibration mode is over, in the normal mode of operation, the output of "color" requested of red primary DAC 62 is commanded as in the past by a digital signal or command $N_R$ on lines 92 so that the lines proper red output current $I_{OR}$ is produced on output line 94 to the printer. Like parts have been given like numbers accompanied by lower case a's and b's, respectively, for DACs 64 and 70 and DACs 66 and 72 which operate in the same way as DACs 62 and 68.

Reference voltage $V_{ref}$, typically 1.2 volts provided at terminal 96, is provided in common to all of the primary and secondary calibration DACs 62, 68, 64, 70, 66 and 72. However, this is not a necessary limitation of the invention as each could be provided with a separate reference voltage source. In an alternative embodiment, one of the calibration DACs, for example 68, along with its reference network 74 and feedback loop 82, all referenced within phantom element 100, may be removed so that there are only two secondary calibration DACs 70 and 72 to service three primary DACs 62, 64 and 66. In this case each of the blue 64 and green 66 DACs may have their outputs controlled digitally independently of one another and of the red primary DAC 62 and then by controlling the blue and the green, the relative output of red primary DAC 62 may also be controlled. If independent control of all of the primary DACs is not required or desired then a secondary secondary calibration DAC such as DAC 70 and its associated feedback loop 82a and reference network 74a as contained in phantom block 102 may also be eliminated so that a single secondary calibration DAC 72 services all three primary DACs. In that case all three primary DACs will be adjustable but only conjointly, not independently. While the particular embodiment shown in FIG. 4 reflects three primary DACs with one, two or three associated secondary calibration DACs, this is not a necessary limitation of the invention, as any number of primary DACs may be employed including as few as one of each and of course the DACs may be used to control any other types of signals in any other well-known applications beyond the specific video RAM-DAC color application explained here as the specific embodiment.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A digitally controlled circuit for a DAC comprising:

a primary DAC having a first reference current input; a second input for receiving a digital signal representative of the DAC conversion factor, and an output for providing the analog signal;

a secondary calibration DAC having associated with it a reference network connected to a first input of said secondary DAC for conducting a reference current, means for connecting the output of said secondary DAC to said reference network, said secondary DAC including a second input for receiving a digital signal for adjusting the output of said secondary DAC fed back to said reference network for adjusting said reference current; and means for interconnecting said reference current with said first reference current input of said primary DAC for digitally controlling the reference current to said primary DAC and digitally effecting calibration of said primary DAC.

2. The digitally controlled calibration circuit for a DAC of claim 1 in which said means for interconnecting is a current mirror.

3. The digitally controlled calibration circuit for a DAC of claim 1 in which said means for connecting includes a feedback loop.

4. The digitally controlled calibration circuit for a DAC of claim 1 in which said reference network includes a voltage divider.

5. The digitally controlled calibration circuit for a DAC of claim 4 in which said voltage divider includes first and second impedances.

6. The digitally controlled calibration circuit for a DAC of claim 5 in which said means for connecting connects to the junction between said impedances.

7. The digitally controlled calibration circuit for a DAC of claim 6 in which said impedances are resistances.

8. A digitally controlled calibration circuit comprising:

at least one primary DAC having a first input for receiving a reference current, a second input for receiving a digital signal representative of the DAC conversion factor, and an output for providing the analog output signal;

at least one secondary calibration DAC having associated with it a reference network connected to a first input of said secondary DAC for conducting a reference current; means for connecting the output of said secondary DAC to said reference network, said secondary DAC having a second input for receiving a digital signal for readjusting the output of said secondary DAC fed back to said reference network for adjusting said reference current; and means for interconnecting said reference current with said first reference input of said at least one primary DAC for digitally controlling the reference current to said at least one primary DAC and digitally effecting calibration of said primary DAC.

9. The digitally controlled calibration circuit of claim 8 in which there are a plurality of said primary DACs and one said secondary calibration DAC which provides said reference current to said reference current inputs of each of said primary DACs for conjointly digitally controlling the outputs of said primary DACs.

10. The digitally controlled calibration circuit of claim 8 in which there are a plurality of said primary DACs and a like plurality of secondary calibration DACs and each of said secondary DACs provides a said reference current to a respective, associated one of said primary DACs for independently digitally controlling the outputs of said primary DACs relative to one another.

11. The digitally controlled calibration circuit of claim 8 in which there are three said primary DACs and three secondary calibration DACs, one associated with each of said primary DACs.

12. The digitally controlled calibration circuit of claim 8 in which there are n primary DACs and n-1 secondary calibration DACs, one associated with each of n-1 said primary DACs.

13. The digitally controlled calibration circuit for a DAC of claim 8 in which said means for interconnecting is a current mirror.

14. The digitally controlled calibration circuit for a DAC of claim 8 in which said means for connecting includes a feedback loop.

15. The digitally controlled calibration circuit for a DAC of claim 8 in which said reference network includes a voltage divider.

16. The digitally controlled calibration circuit for a DAC of claim 8 in which said means for connecting connects to the junction between said impedances.

17. The digitally controlled calibration circuit for a DAC of claim 8 in which said impedances are resistances.

18. A digitally controlled calibration circuit for a color video RAM-DAC comprising:

a red, a blue, and a green primary DAC each having a first input for receiving a reference current, a second input for receiving a digital signal representative of the DAC conversion factor; and an output for providing the analog output signal representative of the respective color;

a red, a blue and a green secondary calibration DAC, one associated with each of said red, blue and green primary DACs respectively; each secondary DAC having associated with it a reference network connected to a first input of that said secondary DAC for conducting a reference current; means for connecting the output of that said secondary DAC to its said reference network; and a second input for receiving a digital signal for adjusting the output of that said secondary DAC fed back to its said reference network for adjusting said reference current conducted by that said reference network; and means for interconnecting each of said reference currents of each said secondary DAC with said first reference current input of the associated one of said primary DACs for digitally controlling the reference current to at least two of said primary DACs.

19. A digitally controlled calibration circuit for a color video RAM-DAC comprising:

a red, a blue, and a green primary DAC each having a first input for receiving a reference current, a second input for receiving a digital signal representative of the DAC conversion factor; and an output for providing the analog output signal representative of the respective color;

at least two secondary calibration DACs, one associated with each of two of said primary DACs respective; each secondary DAC having associated with it a reference network connected to a first input of that said secondary DAC for conducting a reference current; means for connecting the output of that said secondary DAC to its said reference network; and a second input for receiving a digital signal for adjusting the output of that said secondary DAC fed back to its said reference network for adjusting said reference current conducted by that said reference network; and means for interconnecting each of said reference currents of each said secondary DAC with said first reference current input of the associated one of said primary DACs for digitally controlling the reference current to at least two of said primary DACs.

* * * * *